(12) United States Patent
Kozlowski et al.

(10) Patent No.: US 6,493,030 B1
(45) Date of Patent: Dec. 10, 2002

(54) LOW-NOISE ACTIVE PIXEL SENSOR FOR IMAGING ARRAYS WITH GLOBAL RESET

(75) Inventors: Lester J. Kozlowski, Simi Valley, CA (US); David L. Standley, Westlake Village, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 0 days.

(21) Appl. No.: 09/057,202

(22) Filed: Apr. 8, 1998

(51) Int. Cl.[7] ................................................ H04N 3/14
(52) U.S. Cl. ...................... 348/310; 348/312; 250/208.1
(58) Field of Search ........................... 250/208.1, 214.1, 250/214 R; 348/207, 241, 250, 294, 296, 303, 307, 312, 315; H04N 3/14, 9/64

(56) References Cited

U.S. PATENT DOCUMENTS

| | | |
|---|---|---|
| 3,836,862 A | 9/1974 | Seely et al. |
| 4,249,122 A | 2/1981 | Widlar |
| 4,463,383 A | 7/1984 | Sonoda et al. |
| 4,466,018 A | 8/1984 | Sonoda et al. |
| 4,585,956 A | 4/1986 | Lie |
| 4,676,761 A | 6/1987 | Poujois |
| 4,794,247 A | 12/1988 | Stineman, Jr. |
| 5,043,820 A | 8/1991 | Wyles et al. |
| 5,083,016 A | 1/1992 | Wyles et al. |
| 5,296,696 A | 3/1994 | Uno |
| 5,345,266 A | 9/1994 | Denyer |
| RE34,908 E | 4/1995 | Wyles et al. |
| 5,471,515 A | 11/1995 | Fossum |
| 5,541,402 A | 7/1996 | Ackland et al. |
| 5,576,763 A | 11/1996 | Ackland et al. |
| 5,587,596 A | 12/1996 | Chi et al. |
| 5,608,243 A | 3/1997 | Chi et al. |
| 5,710,446 A | 1/1998 | Chi et al. ..................... 257/225 |
| 6,054,704 A * | 4/2000 | Pritchard ................. 250/208.1 |
| 6,130,423 A * | 10/2000 | Brehmer ................... 250/208.1 |
| 6,157,016 A * | 12/2000 | Clark ........................ 250/208.1 |
| 6,163,023 A * | 12/2000 | Watanabe ................. 250/208.1 |
| 6,166,767 A * | 12/2000 | Watanabe ................... 348/301 |

OTHER PUBLICATIONS

CMOS Active Pixel Image Sensors, E. Fossum, Nuclear Instruments & Methods in Physics Research, Section A vol. 395, No. 3, Aug. 21, 1997.

R.H. Dyck and G.P. Weckler; "Integrated arrays of silicon photodetectors for image sensing," IEEE Trans. Electron Devices, ED–15, Apr. 1968, pp. 196–201.

J.D. Plummer and J.D. Meindl, "MOS electronics for a portable reading aid for the blind," IEEE J. Solid–State Circuits, SC–7, Apr. 1972, pp. 111–119.

N. Koike, I. Takemoto, K. Satoh, S. Hanamura, S. Nagahara and M. Kubo, "MOS Area Sensor: Part I—Design consideration and performance of an n–p–n Structure 484 × 384 element color MOS Imager," IEEE Trans. Electron Devices, ED–27 (8), Aug. 1980, pp. 1676–1681.

S. Ohba, M. Nakai, H. Ando, S. Hanamura, S. Shimada, K. Satoh, K. Takahashi, M. Kubo and T. Fujita, "MOS Area Sensor: Part II—Low–Noise MOS Area Sensor withi Antiblooming Photodiodes," IEEE Trans. Electron Devices, ED–27 (8), Aug. 1980, pp. 1682–1687.

(List continued on next page.)

Primary Examiner—Ngoc-Yen Vu
(74) Attorney, Agent, or Firm—Christopher J. Rourk; Akin Gump Strauss Hauer & Feld, LLP

(57) ABSTRACT

An imaging array of active pixel sensors uses a reset amplifier in each pixel in a four transistor CMOS implementation. The reset amplifier acts as a variable resistance in the source-follower amplifier feedback circuit. The variable resistance is controlled by a range reset voltage applied to the reset amplifier thereby nulling the photodiode reset noise. The ramp reset voltage is applied to all reset amplifiers of all pixels at the same time, thereby providing for reset of the entire array at the same time, i.e., global reset.

20 Claims, 5 Drawing Sheets

OTHER PUBLICATIONS

EG&G Reticon Sales Catalog, *Image Sensing and Solid State Camera Products 1994/1995*. Solid State Image Sensor Array Specifications for Part Nos. RA2568N, RA0100A/RA0128N and RA0256B.

H. Ando, S. Ohba, M. Nakai, T. Ozaki, M. Ozawa, K. Ikeda, T. Masuhara, T. Imaide, I. Takemoto, T. Suzuki and T. Fujita, "Design Consideration and Performance of a New MOS Imaging Device," IEEE Trans. On Elec. Dev., ED–32 (8), Aug. 1985, pp. 1484–1489.

N. Tanaka, T. Ohmi and Y. Nakamura, "A Novel Bipolar Imaging Device with Self–Noise–Reduction Capability," IEEE Trans Elec. Dev., 36 (1), Jan. 1989, pp.31–38.

G.P. Weckler, "Storage Mode Operation of a Phototransistor and its Adaptation to Integrated Arrays for Image Detection," IEDM, Oct. 1966. . (Abstract only) No known paper available from professional document delivery services.

N. Tanaka, T. Ohmi, Y. Nakamura and S. Matsumoto, "A Low–Noise Bi–CMOS Linear Imager Sensor with Auto–Focusing Fucntion," IEEE Trans Elec. Dev., 36 (1), Jan. 1989, pp. 39–45.

N. Tanaka, S. Hashimoto, M. Shinohara, S. Sugawa, M. Morishita, S. Matsumora, Y. Nakamura and T. Ohmi, A 310k Pixel Bipolar Imager (BASIS), ISSCC 1989.

G. P. Weckler, "Charge Storage Lights the Way for Solid–State Image Sensors", Electronics, May 1, 1967, pp. 75–78.

G.P. Weckler, "Operation of p–n Junction Photodetectors in a Photon Flux Integrated Mode", IEEE Journal of Solid State Circuits, vol. SC–2, No. 3, Sep. 1967, pp. 65–73.

G.P. Weckler and R.H. Dyck, "Integrated Arrays of Silicon Photodetectors for Image Sensing", WESCON, Aug. 22–25, 1967, pp. 1–8.

L.J. Kozlowski, J. Luo, W.E. Kleinhans and T. Liu, "Comparison of Passive and Active Pixel Schemes for CMOS Visible Imagers", SPIE, vol. 3360, Apr. 1998.*

Ming–Jer Chin, Yen–Bin Gu, Terry Wu, Po–Chin Hsu, and Tsung–Hann Liu, "Weak Inversion Charge Injection in Analog Mos Switches", IEEE Journal of Solid–State Circuits, vol. 30, No. 5, May 1995, pp. 604–606.*

Peter W. Fry, Peter J.W. Noble and Rober J. Rycroft, "Fixed–Pattern Noise in Photomatrices", IEEE Journal of Solid–State Cirucits, vol.SC–5, No. 5, Oct. 1970, pp. 250–254.*

Degrauwe et al., "A Micropower CMOS–Instrumentation Amplifier", IEEE Journal of Solid–State Circuits, vol. SC–20, No. 3, Jun. 1985, pp. 805–807.*

Letter dated Jul. 31, 1998, from Gene Weckler, RAD–ICON Imaging Corp., address to Mark Wettler.*

* cited by examiner

LOW-NOISE ACTIVE PIXEL SENSOR FOR IMAGING ARRAYS WITH GLOBAL RESET

This application is related to application Ser. No. 09/057,423 filed on Apr. 8, 1998 for 'Compact Low-Noise Pixel Sensor with Progressive Row Reset,' and U.S. application Ser. No. 09/268,913 entitled 'Low-Noise CMOS Active Pixel Sensor for Imaging Arrays With High Speed Global or Row Reset' filed on Mar. 16, 1999, which are currently pending and commonly owned with the present application.

BACKGROUND OF THE INVENTION

1. Field of the Invention

The present invention relates to electronic imaging devices and, in particular, to CMOS imagers having a minimum of analog components in each pixel.

2. Description of Related Art

There presently exists many alternatives to CCD sensors for generating video or still images. The various schemes can be grouped into two basic classes, depending upon whether signal amplification is performed at each pixel site or in support circuits outside the pixel array. Passive-pixel sensors perform amplification outside the array. Passive pixel sensors exhibit pixel simplicity and maximized optical fill factor. Active-pixel sensors include an amplifier at each pixel site. Active pixel sensors optimize signal transfer and sensitivity.

The simplest passive pixel comprises a photodiode and an access transistor. The photo-generated charge is passively transferred from each pixel to downstream circuits. The integrated charge must, however, be efficiently transferred with low noise and non-uniformity. Since each column of pixels often share a common row or column bus for reading the signal, noise and non-uniformity suppression are typically facilitated in the "column" buffer servicing each bus. One example of a passive pixel implementation is shown in FIG. 1. It uses a buffer consisting of a transimpedance amplifier with capacitive feedback to yield reasonable sensitivity considering the large bus capacitance. Such charge-amplification was not generally practical for on-chip implementation in early MOS imaging sensors. Accordingly, alternative schemes compatible with NMOS technology were used. The basic scheme shown in FIG. 2 was mass-produced by Hitachi for camcorders. The key refinements with respect to the FIG. 1 scheme include anti-blooming control and circuitry for reducing fixed pattern noise. Though these imagers were inferior to the emerging charge coupled device (CCD) imagers available at the time, similar MOS imagers are still being offered commercially today.

Subsequent efforts at improving passive-pixel imager performance have also focused on column buffer enhancements. The column buffer was improved by using an enhancement/depletion inverter amplifier to provide reasonably large amplification in a small amount of real estate. Its 40 lux sensitivity was still nearly an order of magnitude below that of competing CCD-based sensors. Others worked to enhance sensitivity and facilitate automatic gain control via charge amplification in the column buffer. More recently, the capacitive-feedback transimpedance amplifier (CIA) concept of FIG. 1 has served as a basis for further development, as exemplified by U.S. Pat. Nos. 5,043,820 and 5,345,266. The CTIA is nearly ideal for passive-pixel readout if the problems with temporal noise pickup and fixed-pattern noise are adequately addressed.

Though much progress has been made in developing passive-pixel imagers, their temporal S/N performance is still fundamentally inferior to competing CCD imagers. Their bus capacitance translates to read noise of ≈100 e-. CCDs, on the other hand, typically have read noise of 20 to 40 e- at video frame rates. The allure of producing imagers with conventional MOS fabrication technologies rather than esoteric CCD processes (which usually require many implantation steps and complex interface circuitry) encouraged the development of active-pixel sensors. In order to mitigate the noise associated with the bus capacitance, amplification was added to the pixel via the phototransistor. One such approach called a Base-Stored Image Sensor (BASIS) used a bipolar transistor in emitter follower configuration with a downstream correlated double sample to suppress random and temporal noise. By storing the photogenerated-signal on the phototransistor's base to provide charge amplification, the minimum scene illumination was reduced to $10^{-3}$ lux in a linear sensor array. However, the minimum scene illumination was higher ($10^{-2}$ lux) in a two-dimensional BASIS imager having 310,000 pixels because the photoresponse non-uniformity was relatively high ($\leq 2\%$). These MOS imagers had adequate sensitivity, but their pixel pitch was too large at about 13 $\mu$m. This left the problem of shrinking the pixel pitch while also reducing photoresponse non-uniformity.

Since the incorporation of bipolar phototransistors is not strictly compatible with mainstream CMOS processes, some approaches have segregated photodetection and signal amplification. U.S. Pat. Nos. 5,296,696 and 5,083,016, for example, describe active-pixel sensors essentially comprising a three-transistor pixel with photodiode. These implementations still exhibit inadequate performance. The '696 patent, for example, augments the basic source-follower configuration of the '016 patent with a column buffer that cancels fixed pattern noise, but adds a fourth transistor that creates a floating node vulnerable to generation of random offsets for charge-pumping and concomitant charge redistribution. The '016 patent offers a method for reducing offset errors, but not with adequate accuracy and resolution to be useful for competing with CCDs. Furthermore, these and other similar approaches require 3–4 transistors in the pixel (at least one of which is relatively large to minimize 1/f noise) in addition to the photodiode. These implementations also require off-chip signal processing for best S/N performance because none addresses the dominant source of temporal noise. In order to eliminate or greatly suppress the reset noise (kTC) generated by resetting the detector capacitance, a dedicated memory element is usually needed, either on-chip or off-chip, to store the reset voltage, to apply correlated double sampling and coherently subtract the correlated reset noise while the photo-generated voltage is being read.

This basic deficiency was addressed in U.S. Pat. No. 5,471,515 by developing an active pixel sensor (APS) that uses intra-pixel charge transfer to store the reset charge at each pixel at the start of each imaging frame. The floating gate APS facilitates correlated double sampling with high efficiency by adding several transistors and relying on a photogate for signal detection. The concomitant drawbacks, however, are intractable because they increase imager cost. The former adds several transistors to each pixel and several million transistors to each imager thereby reducing production yield. The latter is not compatible with standard CMOS gate fabrication so a non-standard process must be developed. These deficiencies were tackled in U.S. Pat. Nos. 5,576,763 and 5,541,402 issued to Ackland et al. and U.S. Pat. Nos. 5,587,596 and 5,608,243 issued to Chi et al. Ackland addressed the image lag issues associated with the intra-pixel charge transfer means. But his approach still requires a non-standard CMOS process. Chi reduced pixel complexity by using the simplest possible active pixel comprising only a phototransistor and reset MOSFET. Chi's implementation still suffers from reset noise and compromises spectral response at longer wavelengths because the photodiode is in an n-well.

OBJECTS AND SUMMARY OF THE INVENTION

It is an object of the present invention to provide an active-pixel low-noise imaging system for implementation in CMOS or in other semiconductor fabrication technologies.

It is another object of the present invention to provide a low-noise amplifier for an imaging system that efficiently suppresses reset noise.

It is yet another object of this invention to provide an improved electronic imaging system having an integral low-noise amplifier that reduces cost and power consumption while providing low temporal noise and low fixed pattern noise.

These objects and the advantages of the present invention are accomplished by circuitry at each pixel consisting of a photodetector and four transistors. The first transistor serves as the driver of a source follower during signal read and as the driver of a transimpedance amplifier during signal reset to suppress reset noise without having to implement correlated double sampling using either on-chip or off-chip memory. The second transistor is an access MOSFET used to read the signal from each pixel and multiplex the signal outputs from an array of pixels. The third transistor is a MOSFET that resets the detector after the integrated signal has been read and the detector sense node has effectively been "pinned" by the transimpedance amplifier. The fourth transistor is a MOSFET that acts successively as a switch during signal readout and as a current source during reset. In a typical two-dimensional display, multiplexing can be performed by horizontal and vertical shift registers.

BRIEF DESCRIPTION OF THE DRAWINGS

Other objects and the many attendant advantages of this invention will be readily apparent upon reference to the following detailed descriptions when considered in conjunction with the accompanying drawings in which like reference numerals designate like parts throughout the figures, and wherein.

DETAILED DESCRIPTION OF THE PREFERRED EMBODIMENTS

Figure 1:
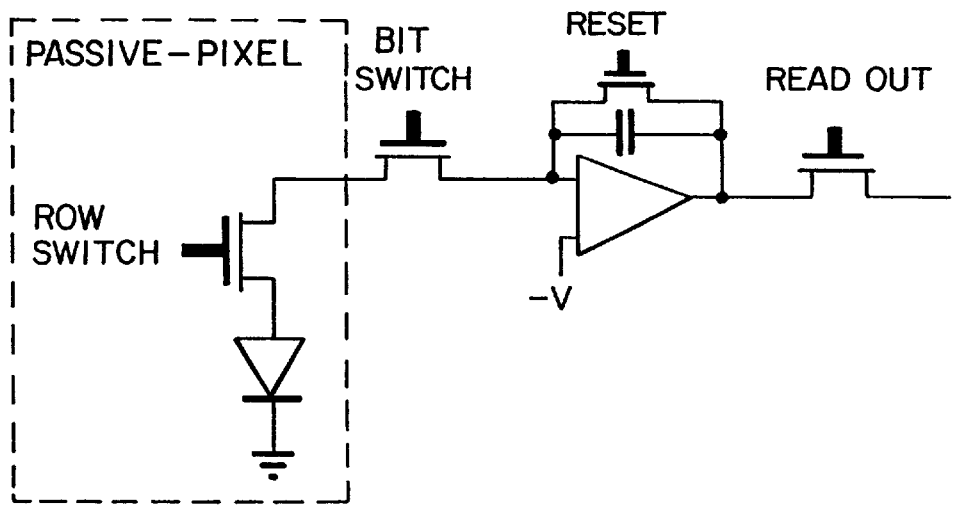
FIG. 1 is a schematic circuit diagram illustrating the amplifier system for a passive-pixel MOS photodiode array of the prior art.
Figure 2:
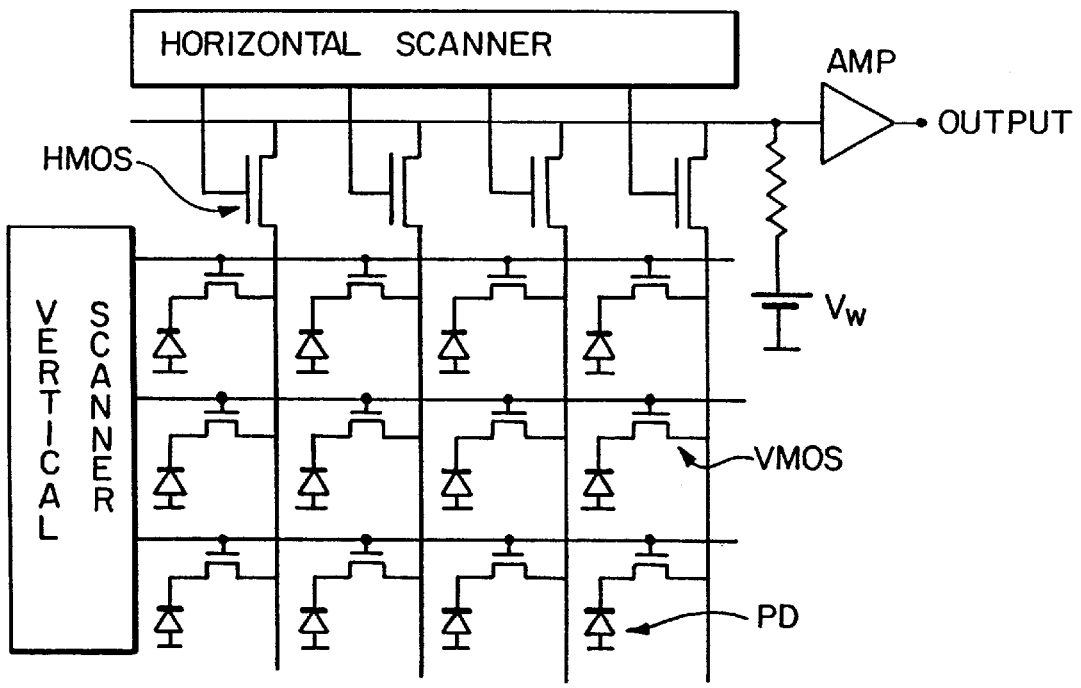
FIG. 2 is a schematic circuit diagram illustrating the amplifier system for a passive-pixel imaging sensor of the prior art.
Figure 3:
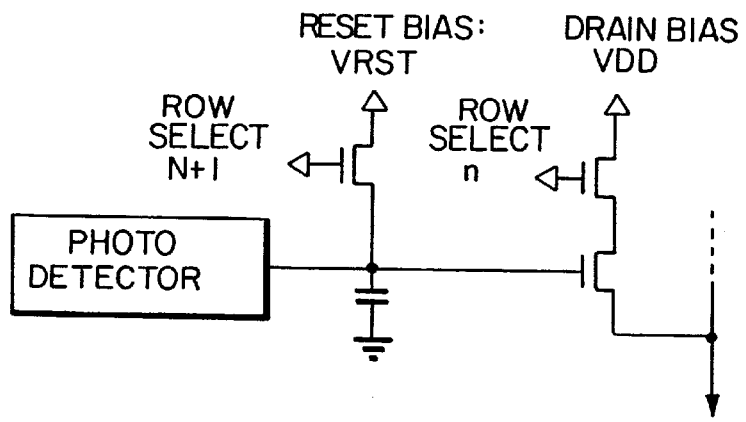
FIG. 3 is a schematic circuit diagram illustrating the amplifier system for an active-pixel imaging sensor of the prior art.

Visible imaging systems implemented in CMOS have the potential for significant reductions in cost and power requirements in components such as image sensors, drive electronics, and output signal conditioning electronics. A video camera, for example, can be configured as a single CMOS integrated circuit supported by only an oscillator and a battery. Such a CMOS imaging system requires lower voltages and dissipates less power than a CCD-based system. These improvements translate into smaller camera size, longer battery life, and applicability to many new products.

Because of the advantages offered by CMOS visible imagers, there has been considerable effort to develop active-pixel sensor (APS) devices. Active-pixel sensors can provide low read noise comparable or superior to scientific grade CCD systems. The active circuit in each pixel of an APS device, however, utilizes cell "real estate" that could otherwise be used to enable imagers having optical format compatible with standard lenses and/or to maximize the sensor optical fill factor for high sensitivity. Active-pixel circuits also may increase power dissipation relative to passive-pixel alternatives, increase fixed pattern noise (possibly requiring additional circuitry to suppress the noise), and limit scalability.

The low noise amplifier system of the present invention is formed by the aggregate circuitry in each pixel and the waveform generation circuits servicing the columns and rows of pixels. The signals from the active pixels are read out by a low-noise signal amplification system consisting of the active-pixel, the waveform generators, a standard column buffer and an output buffer. In addition to means for suppressing the detector's reset noise, the column buffer in the downstream electronics often performs correlated double sampling, sample-and-hold, optional video pipelining, and column amplifier offset cancellation functions to suppress the temporal and spatial noise that would otherwise be generated by the column buffer.

The low-noise system of the present invention provides the following key functions: (1) suppression of reset noise without having to provide means for analog memory and signal subtraction for each pixel; (2) global correlated reset to minimize image distribution due to object motion; (3) high sensitivity signal readout via small sensor mode capacitance; (4) adequate amplifier bandwidth to avoid generation of fixed pattern noise due to variations in amplifier time constant and stray capacitance; (5) adequate power supply rejection to enable development of cameras-on-a-chip that do not require elaborate support electronics; and (6) compatibility with application to imaging arrays having pixel pitch as small as 5 microns when using 0.25 $\mu$m lithography.

The invention has the advantages of full process compatibility with standard silicided submicron CMOS. This helps maximize yield and minimize die cost because the circuit complexity is distributed amongst the active-pixels and peripheral circuits, and exploits signal processing capability inherent to CMOS. The invention's spectral response is broad from the near-ultraviolet (400 nm) to the near-IR (>800 nm).

Because the low-noise system of the present invention has only four MOSFETs in each pixel, the invention offers as-drawn optical fill factor >15% at 7 µm pixel pitch using 0.5 µm design rules in CMOS. The actual optical fill factor is somewhat larger due to lateral collection and the large diffusion length of commercial CMOS processes. A final advantage is the flexibility to collocate digital logic and signal-processing circuits due to its high immunity to electromagnetic interference.

When fully implemented in a desired camera-on-a-chip architecture, the low-noise active pixel sensor (APS) can provide temporal read noise as low as 15 e- (at data rates compatible with either video imaging or still photography via electronic means), fixed pattern noise significantly below 0.1% of the maximum signal (on a par with competing CCD imagers), <0.5% non-linearity, ≧1 V signal swing for 3.3 V power supply, large charge-handling capacity, and variable sensitivity using simple serial interface updated on a frame-by-frame basis via digital interface to a host microprocessor.

A prototype embodiment of the low-noise APS invention formed a visible imager comprising an array of 1032 (columns) by 776 (rows) of visible light detectors (photodetectors). The rows and columns of pixels were spaced 7 microns center-to-center using standard 0.5 µm design rules to provide 15% as-drawn optical fill factor. Subsequent layouts using 0.25 µm rules show that the invention can also provide similar fill factor at 5 µm pitch. Several columns and rows of detectors at the perimeter of the light-sensitive region were covered with metal and used to establish the dark level for off-chip signal processing. In addition, the detectors in each row were covered with color filters to produce color imagers. For example, the odd rows may begin at the left with red, green, then blue filters, and the even rows may begin with blue, red, then green filters, with these patterns repeating to fill the respective rows.

Figure 4:
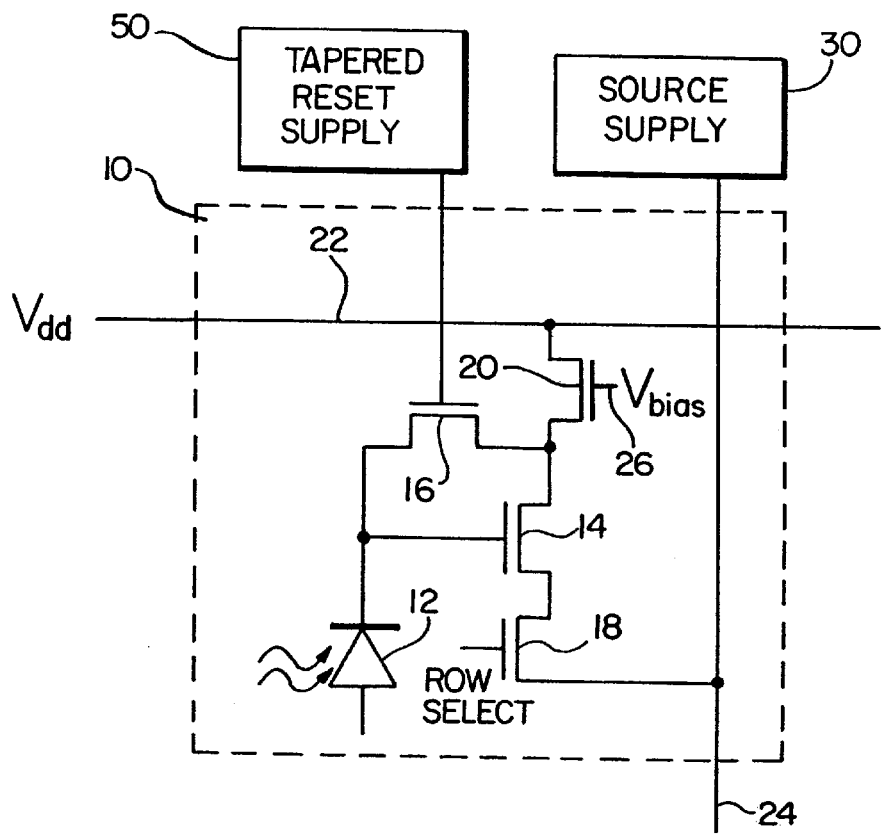
FIG. 4 is a schematic circuit diagram illustrating a preferred embodiment of the low-noise active-pixel of the present invention.
Figure 9:
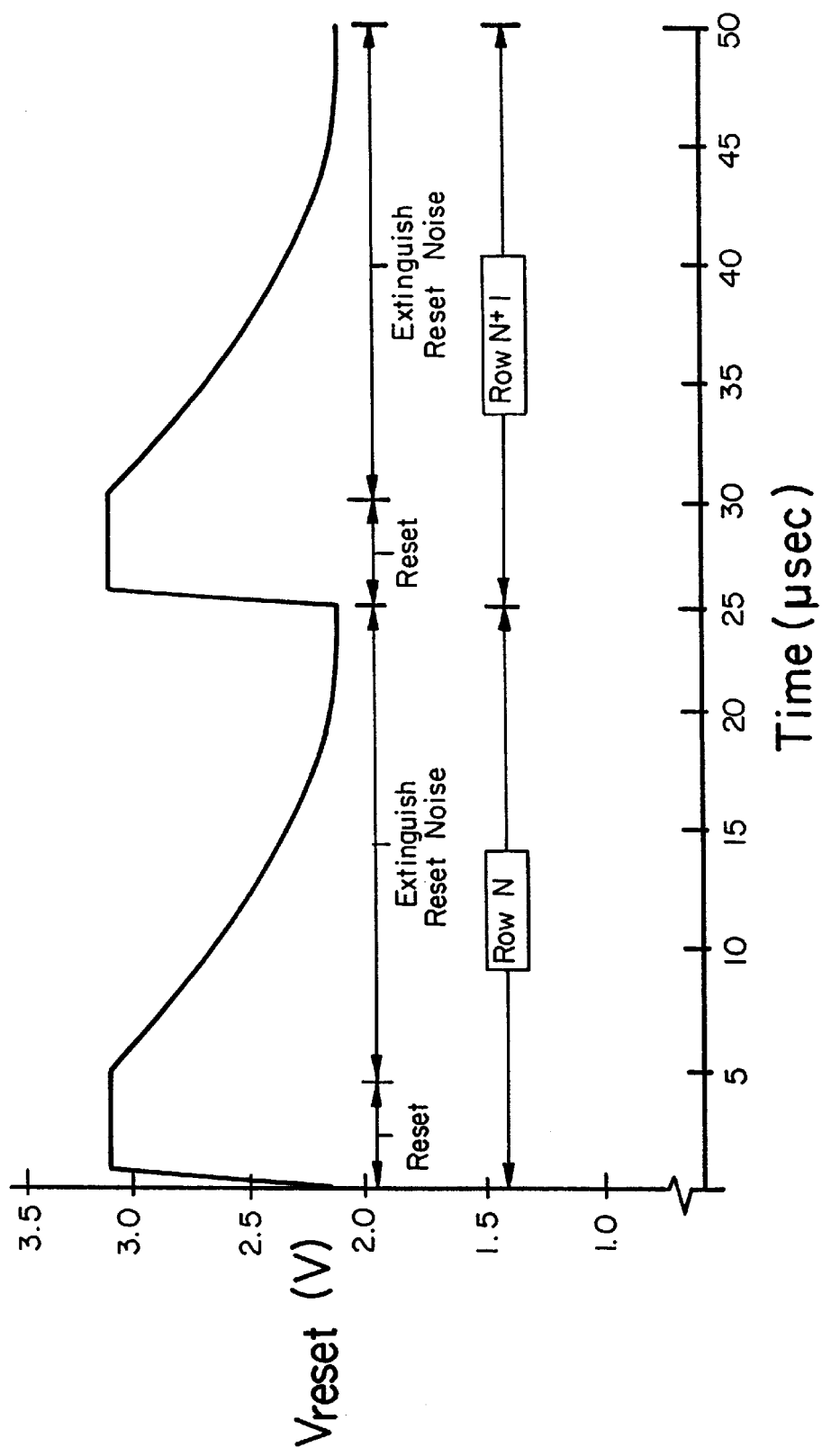
FIG. 9 is a signal diagram showing representative clocking for the tapered-reset waveform.

A low-noise active-pixel sensor 10 according to the present invention is illustrated in FIG. 4. Each pixel 10 in a sensor array (not shown) comprises a photodetector 12, such as a photodiode, for example, connected to the gate of a dual-driver MOSFET 14, and one leg of a reset MOSFET 16. The other leg of MOSFET 16 is connected to a leg of MOSFET 14 and a leg of MOSFET 20. MOSFET 20 acts as a current source during global reset and as a switch during pixel readout. A row select MOSFET 18 has one leg connected to MOSFET 14 and the other leg connected to columns bus 24. Column bus 24 connects all the pixels in a column of the photodetector array by way of the row select MOSFET 18 to a source supply 30. Row bus 22 connects all the pixel resets in a row to an access supply $V_{dd}$. Tapered reset supply 50 supplies an optimized active-pixel reset waveform (FIG. 9) to the gate of MOSFET 16. Photodiode 12 may be a substrate diode, for example, with the silicide cleared. In this embodiment, it is necessary to clear the silicide because it is opaque to visible light. Pixel 10 is designed as simply as possible to obtain the largest available light detecting area while providing broad spectral response, control of blooming and signal integration time, and compatibility with CMOS production processes.

For maximum compatibility with standard submicron CMOS processes, photodiode 12 may be formed at the same time as the lightly doped drain (LDD) implant of n-type MOSFETs for the chosen process; this creates an n-on-p photodiode junction in the p-type substrate. Since no additional ion implantation is necessary, the process and wafer cost for active-pixel circuit 10 are the same as those of standard, high volume digital electronic products.

Figure 5:
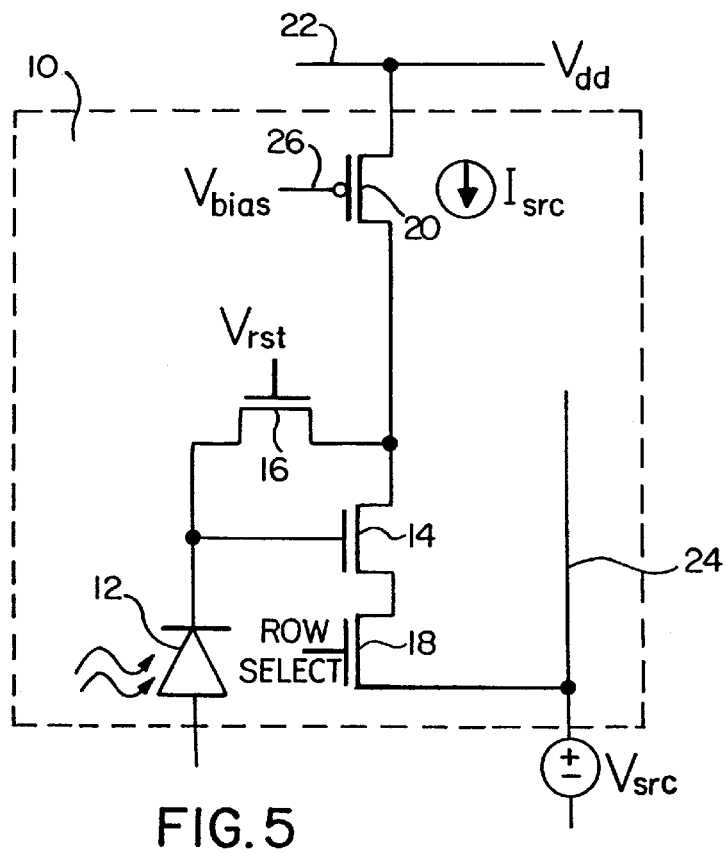
FIG. 5 is a schematic circuit diagram illustrating the operation of the low-noise amplifier system of the present invention during signal reset.
Figure 6:
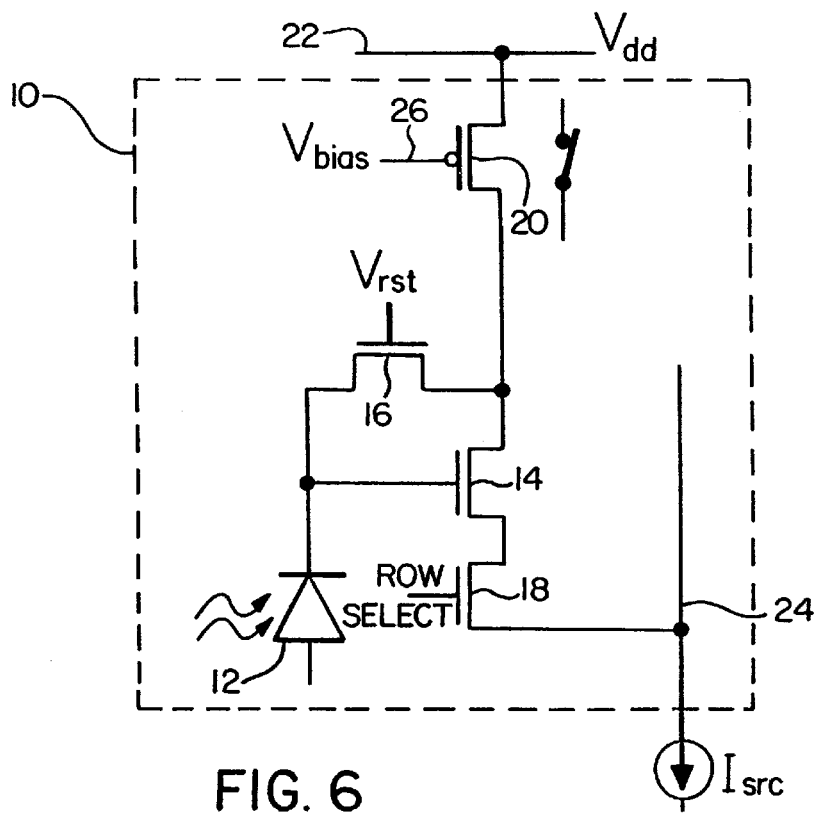
FIG. 6 is a schematic circuit diagram illustrating the operation of the present invention during readout.

FIG. 5 illustrates operation of the circuit of FIG. 4 during pixel reset. FIG. 6 illustrates the operation during readout. In the preferred embodiment, all the photodetectors 12 in the array are reset globally to synchronize the start of image capture.

Reset is initiated by fully enabling the row select MOSFETs 18 of the pixels in the selected row, thereby connecting a low-impedance voltage source (located in source supply 30) to one leg of MOSFET 14 for all the pixels in the row. Dual purpose MOSFET 20 is biased as a current source by waveform $V_{bias}$ on gate 26 so that all the pixel amplifiers in the imager are configured as transimpedance amplifiers with capacitive feedback provided by MOSFETS 14 Miller capacitance. MOSFET 14 thus acts as a transconductance, and reset MOSFET 16 acts as a resistance controlled by the tapered reset supply 50. The series resistance of MOSFET 16 is gradually increased by applying a decreasing ramp waveform (FIG. 9) to the gate of MOSFET 16 to give the feedback transconductance of MOSFET 14 the opportunity to null the reset noise (kTC) via feedback. This active-pixel implementation resets within an aperture of tens of microseconds using standard 0.5 micron CMOS technology.

FIG. 6 shows the same pixel circuit configured in readout mode. The signals from photodetectors 12 are subsequently read out after the prescribed integration time, one row at a time, from bottom to the top of the array. Within each row, photodetectors 12 are read out from left to right. Readout is initiated by turning on the access MOSFETs 18 of all the photodetectors 12 in a selected row and fully turning on MOSFET 20 so that the upper leg of MOSFET 14 is now connected via row bus 22 to low-impedance voltage source $V_{dd}$. The lower leg of MOSFET 14 is connected to a current source at the periphery via column bus 24. MOSFET 14 is now a source follower driver so that the amplified signal from each row-selected photodiode 12 is efficiently transferred to column bus 24.

Figure 7:
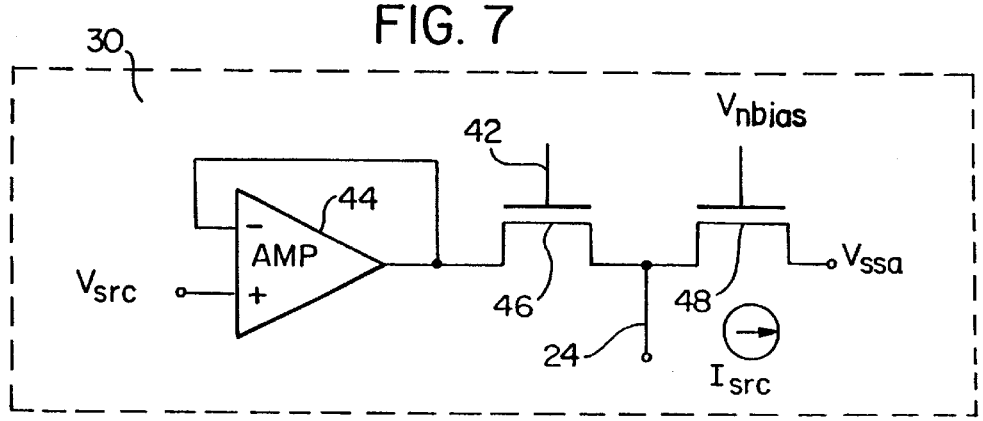
FIG. 7 is a schematic circuit diagram illustrating a preferred embodiment of the column-based source supply circuit.

FIG. 7 shows a preferred embodiment for source supply 30. Supply voltage $V_{SRC}$ is buffered by a unity gain amplifier 44. To facilitate configuring the active-pixels as transimpedance amplifiers for low-noise reset, the gate 42 of transistor 46 is pulsed by the supply voltage to fully turn on transistor 46 and connect $V_{SRC}$ to the output column bus 24. To facilitate active-pixel readout, the gate 42 of transistor 46 is pulsed low to open-circuit transistor 46. Current source 48 then supplies the active-pixels with supply current $I_{SRC}$ which is established by a constant voltage $V_{nbias}$.

The application of the tapered reset waveform (FIG. 9) to the transimpedance amplifier enables the reset noise (kTC noise) envelope to decay before the reset switch 16 (FIG. 4) is completely opened. The invention also reduces the fixed-pattern offsets from MOSFET 14 in each pixel because the photodiode node charges to a voltage that cancels MOSFET 14 variations from pixel-to-pixel. By using a tapered reset, a row is resettable to within several tens of microseconds for full noise suppression, or a shorter time for moderate noise reduction.

Figure 8:
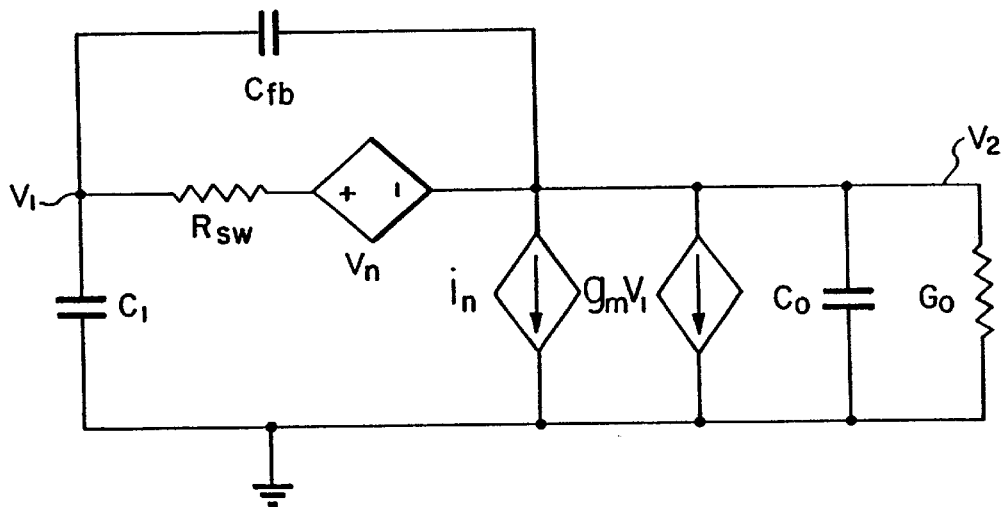
FIG. 8 is a schematic circuit diagram illustrating the small-signal equivalent circuit for the active-pixel sensor of the present invention.

FIG. 8 shows the generalized small-signal equivalent circuit model for the pixel 10 during reset. This circuit allows calculation of the steady-state noise envelope at the reset node depending on reset switch resistance, $R_{sw}$. If the reset voltage is ramped down too slowly, too much time is needed to reset each row and operation at video frame rates becomes problematic. Application to digital still cameras, however, is still quite feasible. If the tapered-reset waveform is ramped down too quickly, then the kTC noise envelope will not decay sufficiently to suppress reset noise before the switch is completely opened.

FIG. 8 shows the photodiode 12 node as having a voltage $V_1$ and capacitance $C_1$ to ground. The amplifier 14 output node has voltage $V_2$, output capacitance $C_0$ and output conductance $G_0$ to ground. The capacitance $C_0$ is associated with the entire reset access bus, most of which comes from the MOSFET 14–MOSFET 16 junction of all the rows. The transconductance of MOSFET 14, possibly degenerated by MOSFET 18, is shown as a controlled current source $g_m V_1$. The feedback capacitance, $C_{fb}$, is the parasitic Miller capacitance of MOSFET 14. Noise from MOSFET 14 is represented by current source $i_n$. Noise from MOSFET 16 (which is operated in the ohmic region) is represented by voltage source $V_n$. Not included in this simplified model is the noise from capacitive feedthrough of the tapered-reset waveform.

Using the small-signal equivalent circuit, a simplified noise formula can be derived since:

$$i_n^2 = \frac{4}{3} kT g_m;$$

$$v_n^2 = 4kT R_{sw}$$

Assuming that the amplifier's dc gain, $A_{dc}$, is much greater than 1, then the rms reset noise is:

$$Q_n \cong \sqrt{kTC_{amp} + C_{sw}} \, h_1 + \sqrt{kTC_{fb}}$$

$$Q_n \cong \sqrt{\frac{kTC_1}{1 + k_1 + k_2}} + \sqrt{kTC_{fb}}$$

where $k_1 = \dfrac{R_{sw} G_0 C_1}{C_0 + C_1}$ and $k_2 = \dfrac{R_{sw} g_m C_{fb}}{C_0 + C_1}$ The tapered-clock waveform's time constant is thus appropriately selected so that the dimensionless quantity $(k_1+k_2)$ is significantly >1. The reset noise is hence reduced to the much smaller quantity stemming from the transconductance amplifier's feedback capacitance. In the present invention, this feedback capacitance is the parasitic Miller capacitance of MOSFET 14.

A preferred embodiment of the present invention has the approximate design values: 1000×700 format, 7 μm×7 μm pixel, $g_m$=20 μmho; $G_0$=0.08 μmho, $A_{dc}$=300; $C_1$=15 fF; $C_0$=3.0 pF and $C_{fb}$=0.3 fF. The desired tapered-clock frequency of 25 kHz that is fully compatible with video rate operation hence requires $R_{sw}$=50 GΩ and an optimum tapered-clock time constant of 25 μs. This yields $k_1+k_2$=58 for the preferred embodiment, and an equivalent noise capacitance of 1.8 fF. Since the nominal detector capacitance is 15 fF and kTC noise is proportional to the square root of the relevant capacitance, the reset noise is suppressed from about 55 e- to only 14 e-.

$R_{sw}$ must be tailored to support any changes in line rate. Increasing the line rate hence requires lower switch resistance. The table numerically illustrates the impact on reset noise as the tapered clock time constant is appropriately shortened. At a time constant of 2.7 μsec, the reset noise degrades to 55 e-.

| Impact on Reset noise for Preferred Embodiment | | | | | | | | |
| --- | --- | --- | --- | --- | --- | --- | --- | --- |
| Rsw (GΩ) | 50 | 20 | 10 | 5 | 2 | 1 | 0.5 | 0.1 |
| k1 + k2 | 58 | 23.2 | 11.6 | 5.8 | 2.32 | 1.16 | 0.58 | 0.12 |
| Reset Noise (e–) | 14 | 17 | 21 | 26 | 35 | 41 | 47 | 55 |
| τ (μsec) | 25 | 25 | 24 | 22 | 18 | 14 | 9.5 | 2.7 |

The column bus 24 is preferably monitored by a standard column buffer to read the video signal when it is available. The key requirements on the column buffer are similar to conventional designs having to handle voltage-mode signals and are well known in the art.

The reset clock signal (FIG. 9), for reset circuit 10, and the clocking of source supply 30 (*FIG. 7) which facilitate active-pixel reset and readout, is generated on-chip using standard CMOS digital logic. This digital logic scheme thus enables "windowing," wherein a user can read out the imager in various formats simply by enabling the appropriate support logic to clock the appropriate subformat. With windowing, the 1032×776 format of the prototype embodiment can be read out as one or more arbitrarily sized and positioned M×N arrays without having to read out the entire array. For example, a user might desire to change a computer-compatible "VGA" format (i.e., approximately 640×480) to either Common Interface Format (CIF; nominally 352×240) or Quarter Common Interface Format (QCIF; nominally 176×120) without having to read out all the pixels in the entire array. This feature simplifies support electronics to reduce cost and match the needs of the particular communication medium. As an example, a personal teleconference link to a remote user having only QCIF capability could be optimized to provide QCIF resolution and thus reduce bandwidth requirements throughout the teleconference link. As a further example, an imager configured on Common Interface Format (CIF) could provide full-CIF images while supplying windowed information for the portions of the image having the highest interest for signal processing and data compression. During teleconferencing the window around a person's mouth (for example) could be supplied more frequently than the entire CIF image. This scheme would reduce bandwidth requirements throughout the conference link.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

What is claimed is:

1. An active-pixel sensor including a radiation detector in a plurality of active-pixel sensors organized into a sensor array, said active-pixel sensor comprising:

a transistor amplifier having an input and an output, its input connected to said radiation detector for generating an electrical signal output having a magnitude that is a function of the charge input from the radiation detector;

a first switch connected to said transistor amplifier for impressing the electrical signal from said transistor amplifier onto an output line;

a variable resistance connected between said transistor amplifier and said radiation detector for resetting the charge input of said transistor amplifier to a predetermined signal level; and a second switch connected to said transistor amplifier and said variable resistance for providing a current source to said transistor amplifier during reset.

2. The active-pixel sensor of claim 1 wherein said first switch comprises a transistor with a first leg, a second leg and a gate, the transistor being connected between said transistor amplifier output and the output line by its first and second legs, a row select signal on the gate turning the transistor on.

3. The active-pixel sensor of claim 1 wherein said second switch comprises a transistor with a first leg, a second leg and a gate, the transistor being connected to said variable resistance and said transistor amplifier by the first leg and to a voltage source by the second leg.

4. The active-pixel sensor of claim 1 wherein said variable resistance comprises a transistor with a first leg, a second leg and a gale, the transistor connected between said transistor amplifier and said radiation detector by its first and second legs, a tapered reset supply voltage being supplied to its gate.

5. The active-pixel sensor of claim 4 wherein the tapered reset supply voltage supplied to the gate of the transistor comprises a decreasing ramp waveform commensurately increasing the series resistance of the transistor, whereby reset noise in the sensor is nulled.

6. The active-pixel sensor of claim 1 where said transistor amplifier is a MOSFET.

7. The active-pixel sensor of claim 6 wherein said first switch is a MOSFET.

8. The active-pixel sensor of claim 7 wherein said variable resistance is a MOSFET.

9. The active-pixel sensor of claim 8 wherein said radiation detector is a photodiode.

10. The active-pixel sensor of claim 9 wherein said second switch is a MOSFET.

11. An active-pixel sensor including a radiation detector in a two-dimensional array of active-pixel sensors organized into rows and columns of sensors, comprising:

a transistor amplifier having an input and an output, its input connected to said radiation detector for generating an electrical signal output having a magnitude that is a function of the charge at its input generated by the radiation detector;

a first switch connected to said transistor amplifier for impressing the electrical signal of its output onto a column output line;

a variable resistance connected between said transistor amplifier and said radiation detector for resetting the charge at said transistor amplifier input to a predetermined signal level; and a second switch connected to said transistor amplifier and said variable resistance for providing a current source to said transistor amplifier during reset.

12. The active-pixel sensor of claim 11 wherein said first switch comprises a transistor with a first leg, a second leg and a gate, the transistor being connected between the output of said transistor amplifier and the column output line by its first and second legs, a row select signal being supplied to the gate to the transistor on.

13. The active-pixel sensor of claim 11 wherein said second switch comprises a transistor with a first leg, a second leg and a gate, the transistor being connected to said transistor amplifier and said variable resistance by the first leg and to a row output line by the second leg.

14. The active-pixel sensor of claim 11 wherein said variable resistance comprises a transistor with a first leg, a second leg and a gate, the transistor being connected between said transistor amplifier and said radiation detector by the first and second legs, a tapered reset supply voltage being supplied to the gate.

15. The active-pixel sensor of claim 12 wherein the tapered reset supply voltage supplied to the gate of the transistor comprises a decreasing ramp waveform commensurately increasing the series resistance of the transistor, whereby reset noise in the sensor is nulled.

16. The active-pixel sensor of claim 11 wherein said variable resistance is gradually increased during reset, whereby reset noise in the sensor is nulled.

17. The active-pixel sensor of claim 15 further comprising a source supply connected to the column output line of a two-dimensional array of active-pixel sensor organized into rows and columns of sensors.

18. The active-pixel sensor of claim 17 wherein said source supply comprises:

a voltage source $V_{SRC}$;

a current source $I_{SRC}$; and means for connecting the voltage source $V_{SRC}$ to said column output line during reset of the sensor, and connecting said current source $I_{SRC}$ to said column output line during readout of the sensor.

19. The active-pixel sensor of claim 16 wherein said second switch comprises a transistor with a first leg, a second leg and a gate, the transistor being connected to said transistor amplifier and said variable resistance by the first leg and to a row output line by the second leg.

20. The active-pixel sensor of claim 19 wherein the second switch transistor connects a current source to said row output line during reset of the sensors, and a voltage source to said row output line during readout of the sensors.

* * * * *

UNITED STATES PATENT AND TRADEMARK OFFICE
CERTIFICATE OF CORRECTION

PATENT NO. : 6,493,030 B1
DATED : December 10, 2002
INVENTOR(S) : Kozlowski et al.

It is certified that error appears in the above-identified patent and that said Letters Patent is hereby corrected as shown below:

Column 9,
Line 6, replace "gale", with -- gate --.

Signed and Sealed this

Eleventh Day of March, 2003

JAMES E. ROGAN
*Director of the United States Patent and Trademark Office*